(12) United States Patent
Lanz et al.

(10) Patent No.: US 7,417,431 B2
(45) Date of Patent: Aug. 26, 2008

(54) COIL ARRAY FOR MAGNETIC RESONANCE IMAGING WITH REDUCED COUPLING BETWEEN ADJACENT COILS

(75) Inventors: Titus Lanz, Wurzberg (DE); Mark Griswold, Shaker Heights, OH (US)

(73) Assignee: Rapid Biomedizinische Gerate Rapid Biomedical GmbH, Rimpar (DE)

( * ) Notice: Subject to any disclaimer, the term of this patent is extended or adjusted under 35 U.S.C. 154(b) by 0 days.

(21) Appl. No.: 10/597,777

(22) PCT Filed: Feb. 10, 2005

(86) PCT No.: PCT/DE2005/000232

§ 371 (c)(1),
(2), (4) Date: Aug. 7, 2006

(87) PCT Pub. No.: WO2005/076029

PCT Pub. Date: Aug. 18, 2005

(65) Prior Publication Data

US 2007/0159176 A1    Jul. 12, 2007

(30) Foreign Application Priority Data

Feb. 10, 2004  (DE) ................. 10 2004 006 322

(51) Int. Cl.
*G01V 3/00* (2006.01)
(52) U.S. Cl. ..................................... 324/318
(58) Field of Classification Search ......... 324/300–322; 600/410–435; 333/219–235; 343/725–730, 343/741–744, 841, 842, 850–873, 878–893, 343/904–906
See application file for complete search history.

(56) References Cited

U.S. PATENT DOCUMENTS

| 4,652,827 | A |   | 3/1987  | Eguchi et al. |
| 4,835,472 | A | * | 5/1989  | Zabel et al. ................. 324/318 |
| 5,293,519 | A | * | 3/1994  | Yoshino et al. ............. 324/318 |
| 5,585,721 | A | * | 12/1996 | Datsikas ..................... 324/318 |
| 5,606,259 | A | * | 2/1997  | Potthast et al. ............. 324/318 |

(Continued)

OTHER PUBLICATIONS

Bock, Nicholas A. et al., "Multiple Mouse MRI," Magnetic Resonance in Medicine, vol. 49, No. 1, pp. 158-167 (Academic Press, Duluth, Minnesota), Published Jan. 2003.

*Primary Examiner*—Brij B Shrivastav
*Assistant Examiner*—Dixomara Vargas
(74) *Attorney, Agent, or Firm*—Edwin D. Schindler

(57) ABSTRACT

A coil array for an imaging apparatus using nuclear magnetic resonance (NMR) for the transmission or reception, or both, of the Lamor frequency signals, assembled in fields, or arrays, includes individual coils made from a conductor track that defines an area. An electrical conductor is applied, at least in the defined area, and is arranged either within or outside the individual coils, and completely surrounding the individual coils and forming a closed circuit.

19 Claims, 6 Drawing Sheets

U.S. PATENT DOCUMENTS

Figure 1:
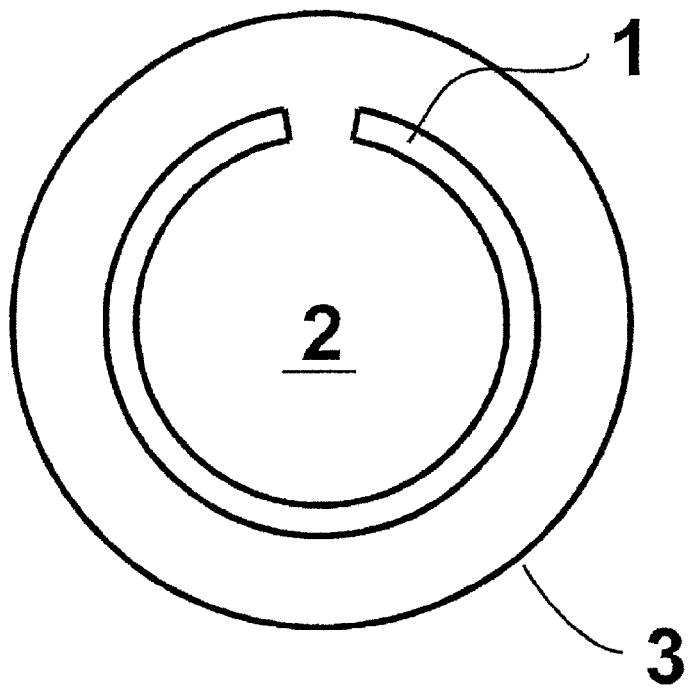

| | | |
|---|---|---|
| 5,661,400 A | 8/1997 | Plies et al. |
| 5,696,449 A * | 12/1997 | Boskamp .................... 324/318 |
| 5,867,027 A * | 2/1999 | Kawamoto ................. 324/322 |
| 5,999,000 A | 12/1999 | Srinivasan |
| 6,249,121 B1 * | 6/2001 | Boskamp et al. ............ 324/318 |
| 6,297,636 B1 * | 10/2001 | Shimo et al. ................ 324/318 |
| 6,320,383 B1 * | 11/2001 | Kato et al. .................. 324/318 |
| 6,487,436 B1 * | 11/2002 | Boskamp et al. ............ 600/422 |
| 6,636,040 B1 * | 10/2003 | Eydelman ................... 324/318 |
| 6,710,598 B2 * | 3/2004 | Leussler et al. ............. 324/318 |
| 6,727,698 B1 * | 4/2004 | Eydelman ................... 324/318 |
| 6,788,056 B2 * | 9/2004 | Vaughan et al. ............. 324/318 |
| 6,847,210 B1 * | 1/2005 | Eydelman et al. ........... 324/318 |
| 7,253,622 B2 * | 8/2007 | Saylor et al. ................ 324/318 |
| 7,268,554 B2 * | 9/2007 | Vaughan ..................... 324/322 |
| 2002/0190717 A1 | 12/2002 | Leussler et al. |
| 2003/0122546 A1 | 7/2003 | Leussler |
| 2003/0155918 A1 | 8/2003 | Young et al. |

* cited by examiner

COIL ARRAY FOR MAGNETIC RESONANCE IMAGING WITH REDUCED COUPLING BETWEEN ADJACENT COILS

BACKGROUND OF THE INVENTION

1. Technical Field of the Invention

The invention relates to an imaging device for use in nuclear magnetic resonance (NMR) using coils that serve for the transmission and/or reception of the frequency signals (Larmor frequency) and which are assembled in fields (arrays), the individual coil comprising a conductor track, which defines an area.

2. Description of the Prior Art

Nuclear magnetic resonance has found widespread use as an important imaging process. Therein, the effect is utilized that atoms in a homogeneous magnetic field, when supplied with energy by means of electromagnetic waves of particular frequencies, undergo excitation by virtue of the absorption. The frequency here is determined from the intensity of the constant magnetic field and the special characteristic properties of the nucleus. After a short time, the excited spin returns to its ground state, that is to say to the lowest energy state, and emits an electromagnetic signal, which is received by means of receiving coils and is utilized to construct the image. In principle, the same coil elements can be used for excitation (transmitting a signal), as well as for reception. To this end, a relatively large number of coils are assembled in so-called arrays. The greater the density, that is to say the number of individual coils per unit area, the better is the signal/noise ratio. Thereby, e.g., the resolution of the image derived can be increased. A decisive advantage is further the possibility of using parallel imaging processes, which make a higher recording rate feasible.

From the prior art (see, for example, WO 02/315 22), so-called MTL (microstrip transmission line) coils are known, which in their simplest configuration consist of a strip-shaped conductor, which is applied to a dielectric and on the opposite side of which a conductive base plate is disposed.

SUMMARY OF THE INVENTION

The central object behind the invention is to further improve the resolution capability, which essentially determines the efficiency, of imaging processes according to the NMR principle. This object is achieved in that an electrical conductor is disposed at least in the area, is arranged within or outside the coil, completely surrounds said coil and is closed.

The term "completely surrounding and closed" means that the conductor represents a closed loop, which, in its three-dimensional profile, is oriented to the conductor track of the coil, that is to say runs in the neighbourhood of, in the most general case with a variable spacing and along the conductor track.

The solution according to the invention is based on the finding that a high resolution capacity is achieved when the array formed by the individual coils has a maximum density, that is to say that as many coil as possible lie as close together as possible. This aim is achieved by means of coils that are as compact as possible in their dimensions and whose relative spacing is chosen to be as small as possible. However, the last requirement has the decisive disadvantage that mutual influences and couplings between adjacent coils, whether during transmission or reception, cannot be excluded. On the basis of these findings, the solution proposed according to the invention starts from a coil formed from a strip-shaped conductor, which, in the manner known from the prior art, may consist of surrounding an open loop outwardly or inwardly with a closed electrical conductor. The conductor runs essentially in the area described by the coil. However, it should not be excluded that the closed conductor may extend perpendicular to the plane described by the coil. A larger number of these predescribed individual coils are assembled in a known manner to form an array.

In the scope of the invention, it is conceivable to mount the conductor within or outside the conductor track of the coil, because, the charge displacements and currents generated for compensation in the conductor by means of impinging wave fields leave the fields emanating from the conductor from the point of application (within or outside the coil) largely uninfluenced. The shielding effect rather occurs in both arrangements. Principle differences of both arrangements can be ascertained either with a large spacing between the coil and conductor and/or a larger distance to the measurement point. The distances become disappearingly small with a small spacing or sufficiently large distance.

Also expressly protected are constructional arrangement in which a conductor runs within and a further conductor runs outside the conductor track of the coil.

DETAILED DESCRIPTION OF THE PREFERRED EMBODIMENTS

The mode of operation is as follows:

In a manner known per se, the coil transmits and/or receives the corresponding radio frequencies essentially perpendicular to the area described by the coil. The surrounding and closed conductor that is additionally applied acts as a shield against both electrical and magnetic fields. The surrounding electrical fields terminate at the conductor, which wards off electrical fields in the manner of a Faraday's cage. The impingement of the magnetic alternating fields additionally effects the development of eddy currents, which, according to Lenz's law, are opposite in direction to the magnetic current generating the eddy currents and thus contribute compensating them. As a result, there follows both electrical and magnetic shielding.

By virtue of the arrangement of the conductor in the area of the coil, a shielding essentially in this direction is effected, so that the transmission and/or reception of signals, which are emitted and/or received essentially perpendicularly to the plane defined by the coil, continues unhindered. In the direction of adjacent coils, which are contiguous essentially in the area defined by the conductor, there follows an almost complete shielding of both electrical and magnetic alternating fields.

The adjacent coil are largely independent of one another and can thus operate at the smallest spacing from one another with the exclusion of mutual influences (transmitting and/or receiving). The proposed coil construction permits a considerable improvement of the signal/noise ratio. The resolution capability and the recording rate can thereby be increased.

The spatial arrangement of the profile of the microstrip forming the coil is, in the most general case, completely optional in the area defined by the coil. The form of a circle, a rectangle, a hexagon or a polygon is preferably to be chosen. These forms in particular, for geometrical reasons permit a dense arrangement of the adjacent coil, which are laterally contiguous with one another as regards their respective areas.

In the most general case, the curvature characteristic of the area defined by the coil is completely optional. In the special case, a plane is preferred because it is practicable to produce.

The conductor that forms the coil and represents the shielding is, as an essential prerequisite of the effectiveness, arranged outside the coil in the area defined by the coil and, additionally, is necessarily closed. Otherwise the compensation currents and voltages within the shielding, which are necessary to compensate the electrical and magnetic fields, would be hindered. The spacing between the coil and the shielding can, in the most general case be chosen with different values. In a specific design, it is preferred for the spacing between the coil and the conductor, which, seen from the centre point, is located outside and forms the shielding, to be chosen with different values around the circumference. However, equidistance is preferred, that is to say a constant spacing between coil and conductor around the entire circumference.

As explained above, a plurality of coils with their shields according to the invention are arranged in fields (array), with a mutually planar assignment and at spacings from one another.

Despite the proposed shielding, there then still remains a coupling, though slight, between adjacent coils. This type of coupling is disadvantageous for several reasons: First, the signal/noise ratio is worse and the adjustment of the individual coils is made considerably more difficult because of the mutual coupling. Likewise, it is in principle impossible to assign the received signals completely to a single coil. In a further development of the concept of the invention, the proposal is utilized that, with an overlapping arrangement of adjacent coils with their shielding, in the most general case only partial compensation may occur, which leads to an electromagnetic decoupling of the coils. A further merit of the invention is that it has recognised that, on consideration of two coils with shieldings, three defined positions of mutual overlapping exist, in which complete electromagnetic decoupling of the two adjacent coils occurs.

One of the positions is defined by the fact that the two shieldings arranged outside the coils overlap one another, but the coils themselves do not mutually overlap.

In the second possible position, the shieldings of one coil overlap not only the shielding of the adjacent coil (as above), but also the coil itself, wherein the coils themselves do not mutually overlap. In the third possible position, the shielding and coil (conductor) of the two coils overlap one another completely. In a consideration of two arrangements, which each consist of a coil and the associated shielding and, as described in the most general case of the invention, only three defined spacings exist with a relative one-dimensional displacement, in which complete electromagnetic decoupling takes place. This does not take into account the fact that with a symmetrical arrangement further points arranged as mirror images exist. As a result, there is achieved a complete electromagnetic decoupling of adjacent coils, a precise assignment of the received signals to a defined coil and the possibility of denser packing of the fields (arrays). This results in an improvement of the signal/noise ratio.

The inherent frequencies of the coils are to be tuned to the resonance frequency of the atoms. The entire arrangement, consisting of coil and shielding, has, by virtue of its construction, inductances and capacitances. To tune to the resonant frequency of the magnetic moment of the nucleus, it is necessary to apply additional inductances and/or capacitances in many cases because of the necessity of tuning.

In particular, it is proposed to apply the capacitances between the coil and shielding; the capacitances thus face in a radial direction from the centre point.

In its most general wording of the claim, it is required that the conductor forming the shielding is to be positioned in the area defined by the coil. The patent expressly also covers those embodiments in which the conductor forming the shielding extends beyond the area on one or both sides—specifically essentially perpendicular thereto. In the case in which a ribbon-shaped conductor is used as shielding, the extension beyond the plane defined by the coil is unavoidable and in general leads to an improvement of the shielding properties.

Its earthing is known from the theory of shielding electrical fields by means of Faraday's cages. Because of the symmetrical construction of the coil and shielding, symmetrical conditions apply with reference to the electrical charge displacements and/or eddy currents that form in the shielding, that is to say that compensation occurs within the shielding when it is considered integrally. Earthing of the shielding is not absolutely necessary, because the shielding remains equipotential. Nevertheless, in an expedient development, earthing of the shielding is proposed.

The coil circuit is connected outwardly via a supply (during transmission) or via an evaluation unit (during reception). In particular operating modes, there is interest in deactivating particular coils, for example if a coil is to be used only for transmission or only for reception, or else if only individual coils are to be used in the work. For this event, it is proposed to short circuit the coil via a PIN diode. The name PIN is derived from the three regions of the diode (positive, intrinsic, negative) and is an externally switchable diode that is open in the operating state and renders the coil inactive on short circuiting. By means of the actuation, the action of the coil can be easily connected and disconnected.

In an advantageous development, the conductor acting as shielding can also be temporarily opened via a switch. On opening, the shielding effect is disconnected; in the case of a closed conductor, on the other hand, the shielding is connected. In particular operating states, for example during transmission, it is advisable to render the shielding inactive to avoid energy losses by disconnect it in the above-described manner. A further advantage consists in the fact that, in the inactive operating state, that is to say with a disconnected coil, a further disconnection of the shielding offers the decisive advantage of avoiding distortion of the magnetic field. The constructional implementation of the temporary opening or closing of the conductor is in principle free within the scope of the invention. In a similar manner to the coil, bridging can be carried out with a switchable diode, which performs the connecting and closing of the diodes in the conducting direction. Actuation is possible by the use of PIN diodes.

BRIEF DESCRIPTION OF THE DRAWING FIGURES

Further embodiments, advantages and features of the invention can be taken from the following descriptive part, in which an exemplary embodiment of the invention is explained with reference to the drawing, wherein FIG. 1 shows construction of a coil according to the invention diagrammatically in top view FIGS. 2 to 9 show various constructional solutions of the concept according to the invention.

Figure 10:
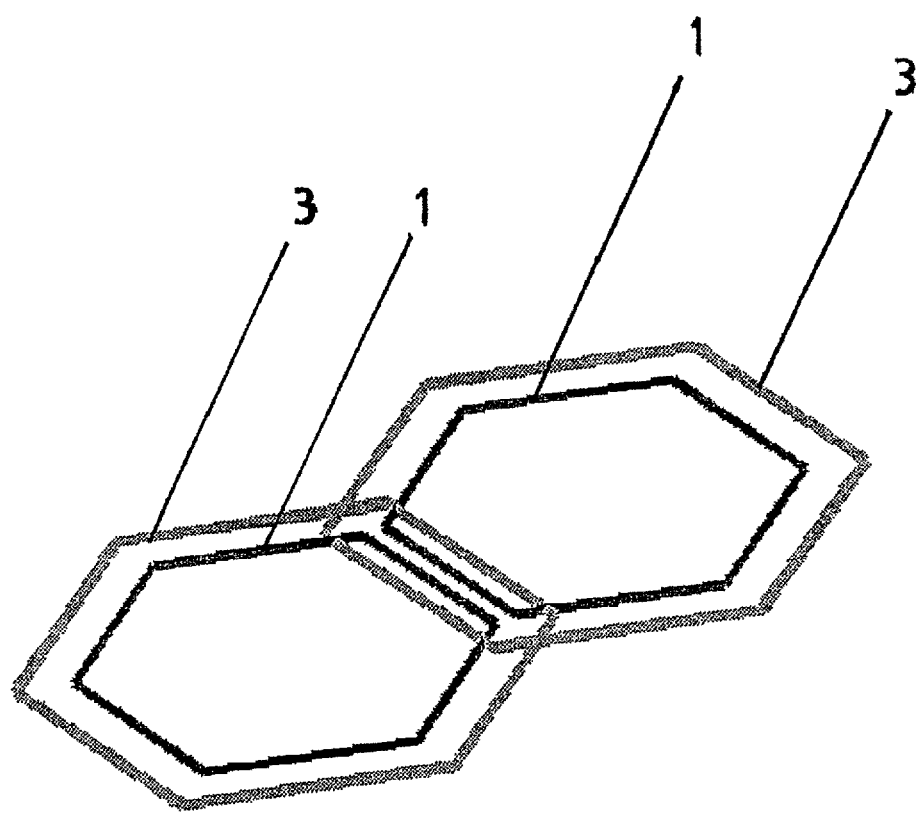

FIG. 10 shows an overlapping of the electrical conductors, forming the shielding, of two adjacent coils

DETAIL DESCRIPTION OF THE DRAWING FIGURES

The coil (1) in the illustrated exemplary embodiment consists of a single strip-shaped conductor arranged with an approximately rectangular profile and fixed to a base plate. Not shown are the connections to a power supply in the case of operation as a transmission coil or a frequency decoder in the case of operation as a receiving coil, which can be produced by means of a coaxial cable or other connections. Such coils, which are made from a single strip (1), are known by the term microstrip transmission line (MTL) in the prior art.

The proposed development according to the invention consists in the fact that, as regards the coil (1), a conductor is mounted on the area (2) defined thereby which is closed and surrounds said coil (1). Earthing is in the most general case not absolutely necessary.

This surrounding conductor (3) has the function of a shielding against both electrical and magnetic fields, the shielding against electrical fields taking place essentially according to the principle of a Faraday's cage and shielding against magnetic alternating fields taking place by the induction of eddy currents, which lead to a compensation of the incident magnetic fields.

As a result, an extensive shielding of the coil (1) is obtained against the interference fields acting essentially in the direction of the area (2) (this is the direction in which the adjacent coils of the array are arranged) but also the reduction of the influencing of adjacent coils by the coil under consideration. Influencing of transmission and/or reception of signals, which extend essentially perpendicular to the surface (2) and thus perpendicular to the plane of the drawing, does not take place.

In the following drawings, different solutions of the concept according to the invention are shown in diagrammatic view.

Figure 2:
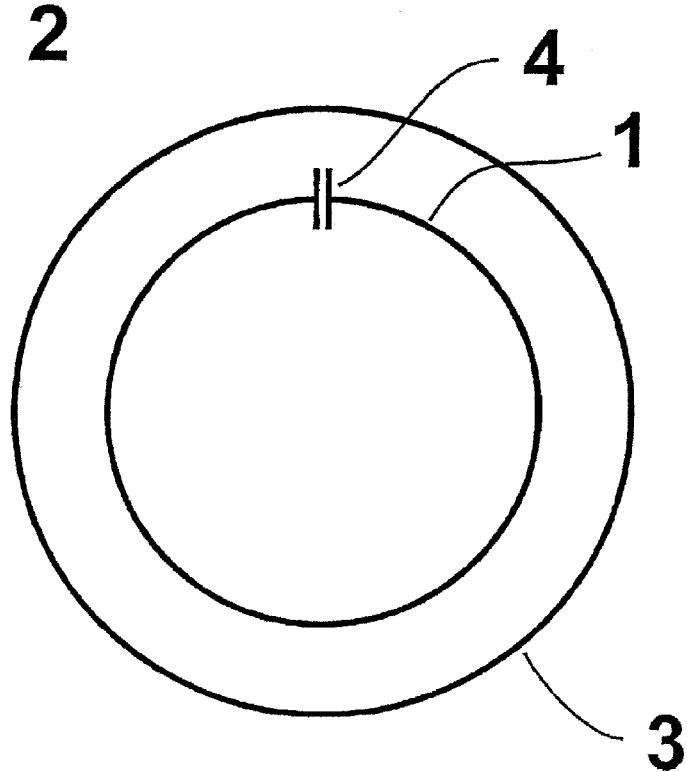

FIG. 2 shows a solution in which the coil 1 is bridged by means of a capacitor 4, whereas the conductor 3 is closed, extends coaxially and is spaced outwardly.

Figure 3:
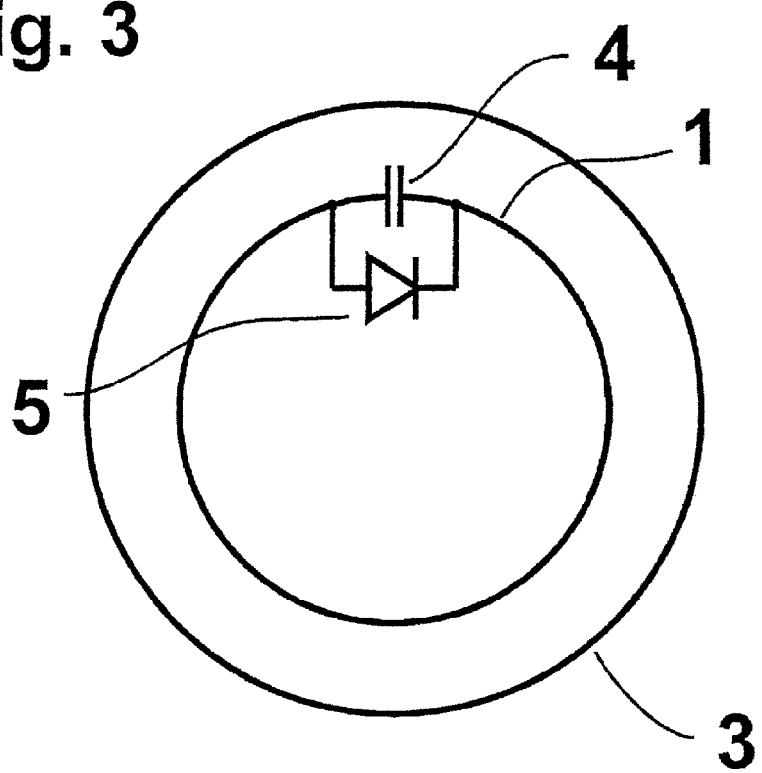

A comparable solution is shown in FIG. 3, with the difference that, in addition to the bridging of the capacitor 4, a switchable diode 5 is used. Short circuiting the capacitor results in closing of the coil 1.

Figure 4:
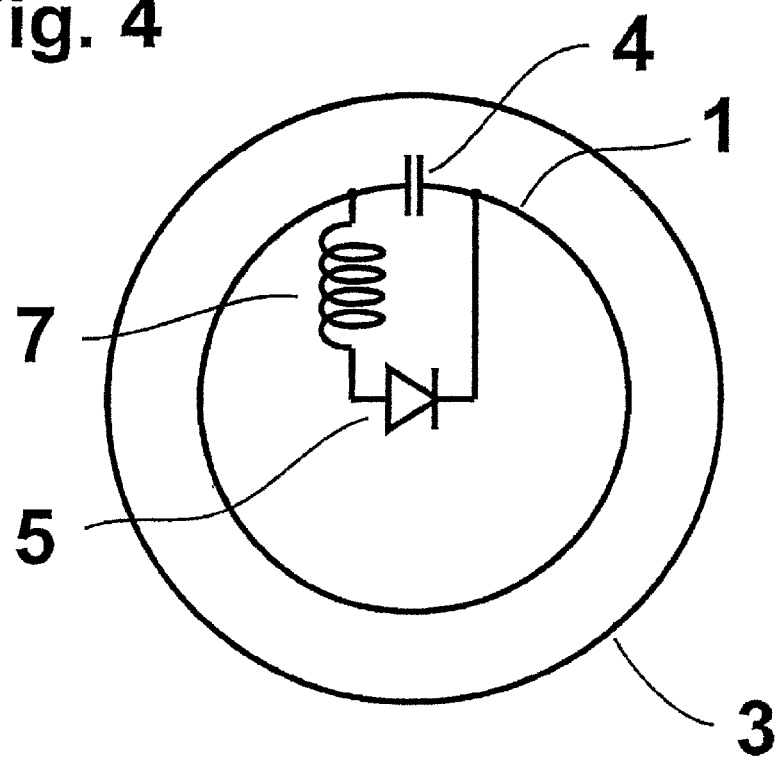

FIG. 4 shows a comparable arrangement with the difference that an inductance 7 is connected in series with diode 5. The oscillation behaviour can, in a known manner, be tuned as required by appropriate choice of the capacitor 4 as well as by the inductance 7.

Figure 5:
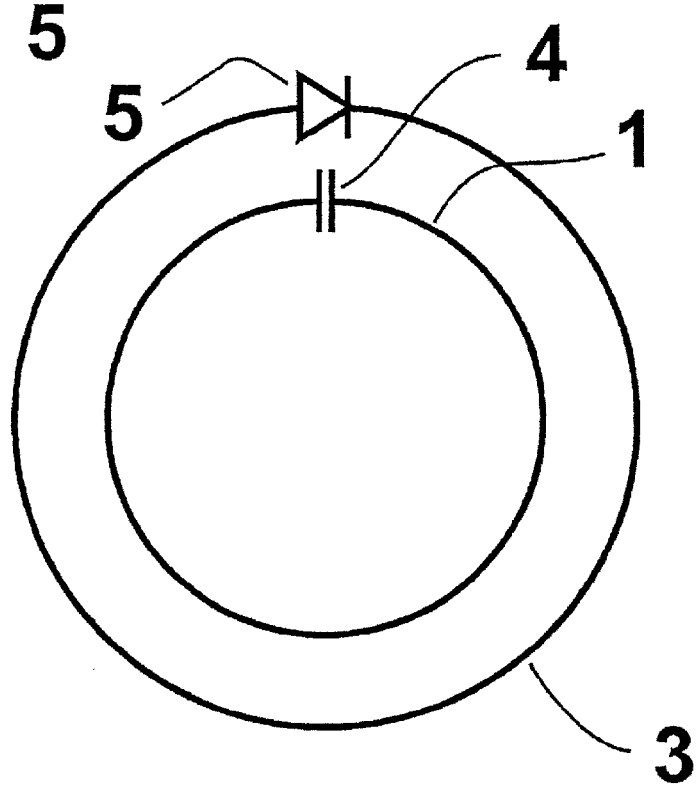
Figure 6:
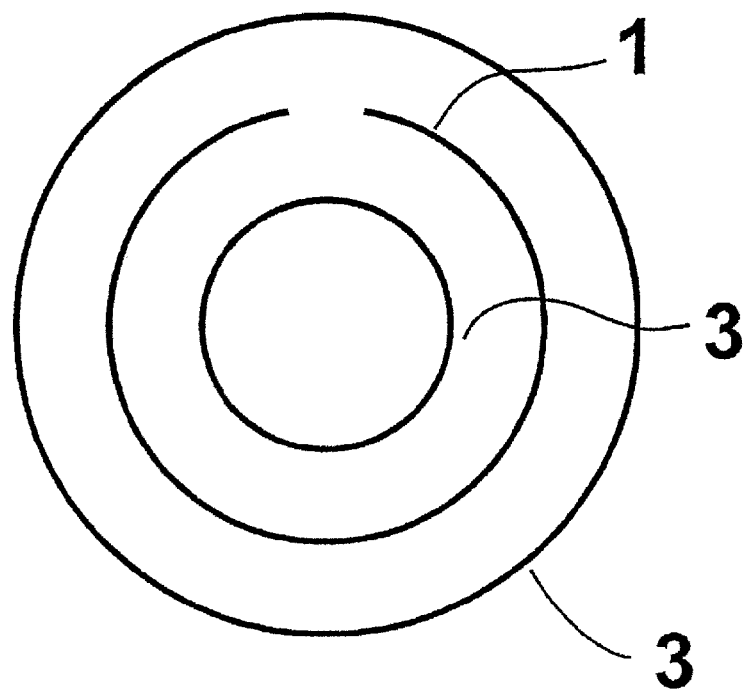

FIG. 5 shows an arrangement in which the coil 1, which is opened by capacitor 4, is surrounded by a conductor 3, in which the switchable diode 5 is arranged. The shielding effect of the conductor 3 can be influenced in its effect by connecting/disconnecting the diode 5.

An implementation of the concept according to the invention that deviates fundamentally from the arrangements described above is shown in FIG. 6. In this case, the coil 1 is open. A conductor 3, which is closed and serves for shielding, runs coaxially in each case not only on the outside but also on the inside. In distinction to the above-described cases, attachment of the conductor 3 can also (additionally) take place within the coil 1.

Figure 7:
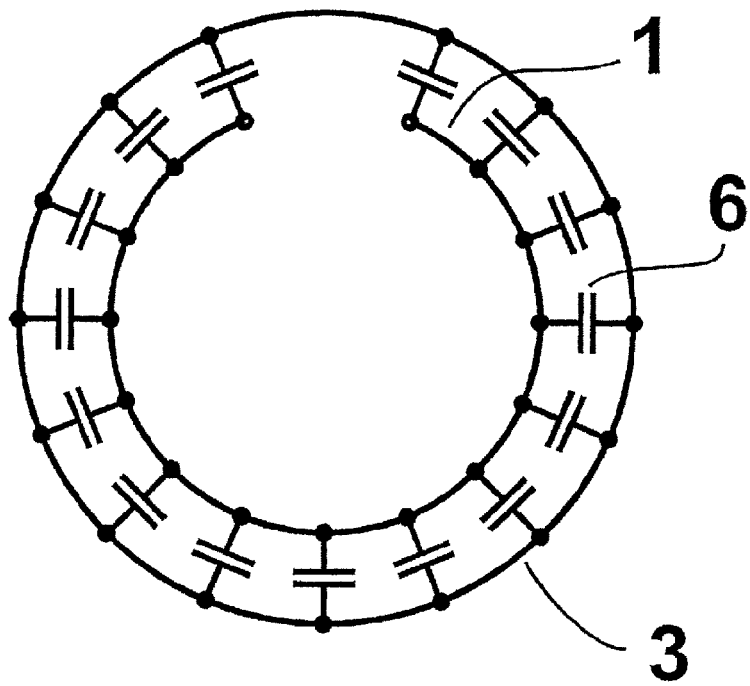

An arrangement consisting of an open coil 1, which is arranged on the inside, and a conductor 3, which is arranged coaxially on the outside and serves as shielding, is shown in FIG. 7. The characteristic feature of this arrangement is the attachment of additional capacitances between the conductor and coil. By corresponding choice of the number and size of the capacitances and the fact that electrical conductors have inductances in the scope of higher frequency ranges, the oscillation behaviour and in particular the resonance frequency can be influenced and adjusted.

Figure 8:
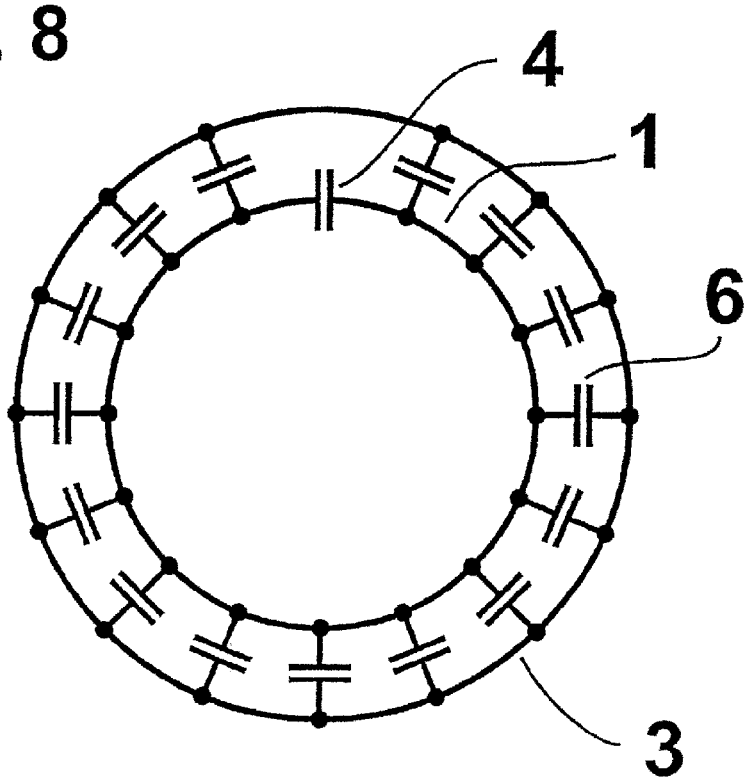

In FIG. 8, instead of the diode, a capacitor 4 was installed, which represents an opening of the coil for direct current, and a bridging of a corresponding resistor, which is frequency dependent, for alternating current.

Figure 9:
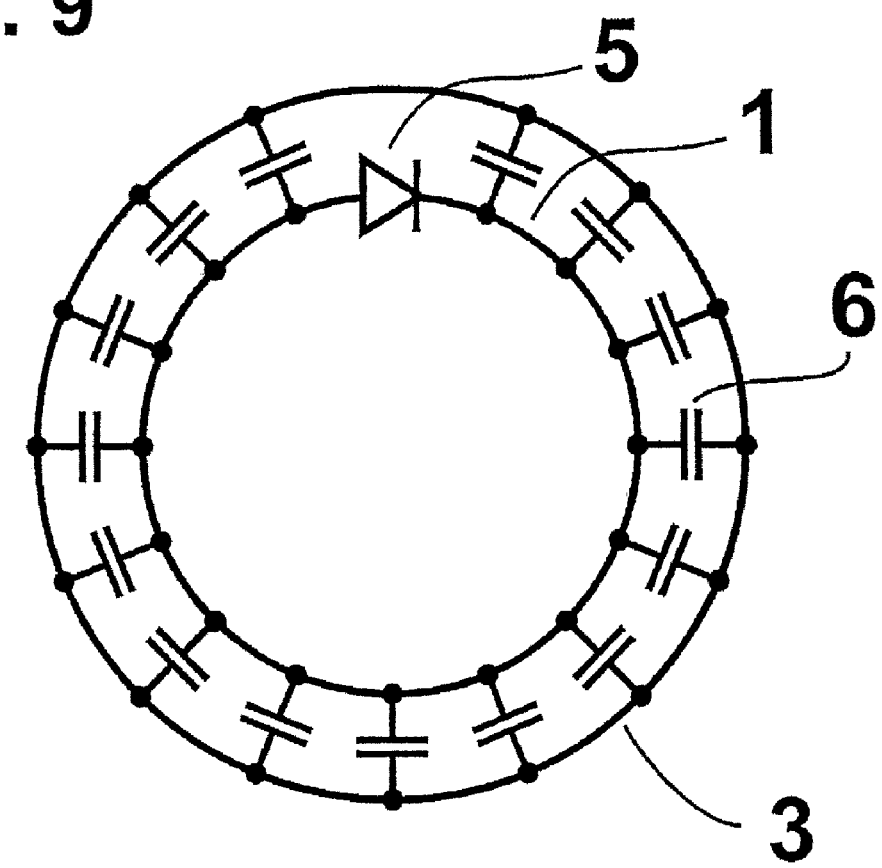

FIG. 9 shows an arrangement comparable to this, with the difference that the coil is bridged by means of a switchable diode 5. A short circuiting of the coil is thus readily possible externally without problems.

FIG. 10 shows, in a diagrammatic view, two adjacent coils 1 that are mutually overlapping. Each of these coils 1, which are identical in construction, is surrounded on the outside by an electrical conductor 3, which serves as shielding. Overall, innumerable relative arrangements of two coils (with shielding) with respect to one another are conceivable, of which three different positions existing, in which a complete electromagnetic decoupling of the adjacent coils takes place. One of these positions is shown.

Two coils 1 of identical construction of hexagonal form are shown, which are surrounded coaxially externally by means of the electrical conductor 3 which serves for shielding. The relative position of the two coils is such that the electrical conductor 3, serving as shielding, of one coil 1 overlaps the electrical conductor 3, which serves as shielding, of the adjacent coil, as well as the coil 1 itself. At the same time, the distance remains so large that overlapping of the coils 1 themselves does not occur. Conversely, the second coil with its shielding overlaps the first-described coil in the same way. The described arrangement leads to a complete electromagnetic decoupling of the two coils 1 illustrated.

The invention claimed is:

1. An imaging apparatus for nuclear magnetic resonance, comprising:
   a plurality of coils assembled in a field array with each individual coil of said plurality of coils capable of transmitting or receiving, or both, frequency signals, each said individual coil including:
      a conductor path defining an area; and,
      an electrical conductor disposed in said area with said electrical conductor being arranged either within, or outside of, said individual coil and completely surrounding said individual coil for forming a closed circuit, said electrical conductor not being a superconductor,
   wherein each said electrical conductor for each said individual coil forms a shielding and is arranged outside of each individual coil.

2. The imaging apparatus for nuclear magnetic resonance according to claim 1, wherein there are at least two said electrical conductors with a first electrical conductor being arranged within said individual coil and a second electrical conductor being arranged outside said electrical coil.

3. The imaging apparatus for nuclear magnetic resonance according to claim 1, wherein said each individual coil or said electrical conductor has a spatial profile having a polygonal shape.

4. The imaging apparatus for nuclear magnetic resonance according to claim 1, wherein said area is a plane.

5. The imaging apparatus for nuclear magnetic resonance according to claim 1, wherein said electrical conductor is arranged outside of each said individual coil and completely surrounds each said individual coil by an equidistance.

6. The imaging apparatus for nuclear magnetic resonance according to claim 1, wherein each said electrical conductor of each said individual coil adjacent one another, at least, partially overlap one another.

7. The imaging apparatus for nuclear magnetic resonance according to claim 1, wherein each said electrical conductor forming said shielding, at least partially, overlaps an adjacent said electrical conductor and an adjacent said individual coil, with overlapping of adjacent said individual coils not occurring.

8. The imaging apparatus for nuclear magnetic resonance according to claim 1, wherein each said electrical conductor forming said shielding and said conductor path of each said individual coil overlap one another.

9. The imaging apparatus for nuclear magnetic resonance according to claim 1, wherein each said individual coil includes an inductance incorporated into said individual coil.

10. The imaging apparatus for nuclear magnetic resonance according to claim 1, wherein each said individual coil includes a capacitance incorporated into said individual coil.

11. The imaging apparatus for nuclear magnetic resonance according to claim 10, wherein said capacitance is arranged between said individual coil and said electrical conductor.

12. The imaging apparatus for nuclear magnetic resonance according to claim 1, wherein each said electrical conductor includes an inductance incorporated into said electrical conductor.

13. The imaging apparatus for nuclear magnetic resonance according to claim 1, wherein each said electrical conductor includes a capacitance into said electrical conductor.

14. The imaging apparatus for nuclear magnetic resonance according to claim 1, wherein each said individual coil is able to be short-circuited via a switchable diode.

15. The imaging apparatus for nuclear magnetic resonance according to claim 14, wherein said switchable diode is a PIN diode.

16. The imaging apparatus for nuclear magnetic resonance according to claim 1, wherein each said electrical conductor is able to be temporarily opened via a switch.

17. The imaging apparatus for nuclear magnetic resonance according to claim 16, wherein said switch is a switchable diode.

18. An imaging apparatus for nuclear magnetic resonance, comprising:

a plurality of coils assembled in a field array with each individual coil of said plurality of coils capable of transmitting or receiving, or both, frequency signals, each said individual coil including:

a conductor path defining an area; and, an electrical conductor disposed in said area with said electrical conductor being arranged either within, or outside of, said individual coil and completely surrounding said individual coil for forming a closed circuit, said electrical conductor not being a superconductor, wherein said electrical conductor, forming a shielding, extends perpendicularly beyond said area in, at least, one direction.

19. An imaging apparatus for nuclear magnetic resonance, comprising:

a plurality of coils assembled in a field array with each individual coil of said plurality of coils capable of transmitting or receiving, or both, frequency signals, each said individual coil including:

a conductor path defining an area; and, an electrical conductor disposed in said area with said electrical conductor being arranged either within, or outside of said individual coil and completely surrounding said individual coil for forming a closed circuit, said electrical conductor not being a superconductor, wherein said electrical conductor forms a shielding that is earthed.

* * * * *